US006993736B2

(12) United States Patent
Syed et al.

(10) Patent No.: US 6,993,736 B2
(45) Date of Patent: Jan. 31, 2006

(54) PENDING BUG MONITORS FOR EFFICIENT PROCESSOR DEVELOPMENT AND DEBUG

(75) Inventors: Ikram Hussain Syed, Allen, TX (US); John Ribe, Chicago, IL (US)

(73) Assignee: Texas Instruments Incorporated, Dallas, TX (US)

( * ) Notice: Subject to any disclaimer, the term of this patent is extended or adjusted under 35 U.S.C. 154(b) by 230 days.

(21) Appl. No.: 10/732,650

(22) Filed: Dec. 10, 2003

(65) Prior Publication Data

US 2005/0149805 A1    Jul. 7, 2005

(51) Int. Cl.
  *G06F 17/50*    (2006.01)
(52) U.S. Cl. .................................. 716/4; 716/5; 716/18
(58) Field of Classification Search ................ 716/4–5, 716/18; 703/13–14
  See application file for complete search history.

(56) References Cited

U.S. PATENT DOCUMENTS 6,487,704 B1 * 11/2002 McNamara et al. ........... 716/5
6,536,020 B2 * 3/2003 Sato .............................. 716/4

\* cited by examiner

*Primary Examiner*—Paul Dinh
(74) *Attorney, Agent, or Firm*—Robert D. Marshall, Jr.; W. James Brady, III; Frederick J. Telecky, Jr.

(57) ABSTRACT

This invention addresses difficult issues encountered in simulations and design verification efforts on complex microprocessor/digital signal processor devices. The invention provides a means for monitoring and tracking pending bugs and automates the rejection of already known/pending bugs. This allows developers/debuggers to focus on finding and correcting new bugs. This improves design development efficiency many fold and lets design engineers and verification engineers focus on real, new and unique issues. This is especially true when test cases are generated in a random way and the test case contents are actually unknown.

6 Claims, 4 Drawing Sheets

PENDING BUG MONITORS FOR EFFICIENT PROCESSOR DEVELOPMENT AND DEBUG

TECHNICAL FIELD OF THE INVENTION

The technical field of this invention is tools in design verification of integrated circuits.

BACKGROUND OF THE INVENTION

Design verification (DV) of complex digital devices has developed rapidly as a technical discipline to keep pace with the immense progress in design methodology. As such, design verification addresses various facets of the efforts required stage through the register transfer logic model RTL stage and to the gate level implementation.

Some of these facets of the design verification task are listed below:

1. Functional verification of the implementation against the specification which verifies both the architectural and implementation specific device requirements;
2. Performance verification which evaluates the cycle count involved in multiple clock sequences against optimal performance;
3. Test plan design and test specification design: creation of stimulus/test cases;
4. Formal model checking and state machine analysis;
5. Creation of test coverage models (monitors); and
6. Bug tracking and reporting.

The design verification task is the effort of many contributors working jointly with the design team. Both the verification team and the design team are strongly committed to generating a design meeting all aspects of the device specification and establishing confidence that the new device is totally free of any failures (bugs) to operate exactly as specified.

The design verification effort for a complex integrated circuit may be addressed by at least tens if not over a hundred engineers and requires a high degree of coordination and mutual support if it is to be accomplished efficiently. A most crucial problem is to track tightly bugs that are identified, whether corrective action has occurred, and whether new bugs found have comprehended all the latest designs changes addressing previously found bugs. The verification effort suffers greatly when engineering effort is devoted to determining whether the last set of bugs identified have already been fixed. This type of invalid information is possible because the design is constantly being updated and simulations must proceed even though there is not complete awareness on the part of all involved which bugs have been fixed and which are still being addressed.

FIG. 1 illustrates the basic flow relating design models, simulation control, test patterns, test cases and simulation results according to the prior art. First, it will be helpful to clearly define the important types of models involved.

The Reference Functional Model (RFM) 100 is not a cycle-accurate model. As such the results from reference functional model simulations cannot be related on a clock-by-clock basis but only as the final result of the execution of an instruction. The Reference Functional Model 100 is simply an architectural model which exactly executes each instruction but without any intermediate information available during the execution. The Reference Functional Model 100 takes one instruction, executes it, provides the results and then moves to the next instruction. This Reference Functional Model 100 is mainly used to generate instruction-set combinatorial test cases.

The Golden C-Model (GCM) included in block 106 is a clock-cycle-accurate instruction set execution model that provides detailed information during the execution of each instruction and for each clock cycle of the execution, as each instruction is a multi-cycle path from its decode to its execution.

FIG. 1 illustrates the relationship between models and verification tasks. The Reference Functional Model 100 is used to drive directed random test case generation 101. Control files block 102 is developed by an engineer to direct the flow of the random test generation. The output of the random test generation 101 is a large number of test cases 103, typically thousands. These test cases exercise the device under test in an extensive manner that could not be addressed by manual generation and the result is that adherence to many functional requirements is quickly explored. The RTL simulation 104 and the Reference Functional Model/Golden C-Model 106 use these extensive test cases 103 to produce the simulation result noted by change detector 105. If the many thousands of random test cases 103 are effective and score hits on prevailing bugs, many thousands of failures 107 are generated. This kind of shot gun approach to revealing and identifying bugs in the design is indispensable in progressing in a timely fashion toward a bug-free design.

FIG. 2 illustrates the concepts of functional coverage and monitoring features and their interaction with test generation and simulation flow on a complex digital processor product according to the prior art. The central block element test generation and simulation 200 includes all the complex processes involved in the random as well as manual test generation and simulation using ever improving simulation software packages. The test generation and simulation 200 draws on two sources of input information: control files 201; and a pool of functional monitors 203. The remaining blocks emphasize the various aspects of functional coverage and bug monitoring. The test generation and simulation block 200 produces two main outputs: a passed test record 202; and a filed test record 204. Functional coverage report 205 generates a report on the functional coverage of the tests using the passed test record 202. Failed tests from failed test record 204 are processed in the test case filter block 206 and with an input from the monitor algorithms block 207. The test to debug block 208 generates details of the task of tests for debug. Engineering interaction with this flow proceeds from the test to debug block 208 and includes items in block 210, such as evaluation of the results of the most recent simulation and action items to be undertaken in the bug fixing process. Other engineering interaction includes evaluation of functional coverage results from functional coverage report block 205 and modification of control file 201.

The Reference Functional Model and the Golden C-Model of block 106 of FIG. 1 can both be linked with a post-processing environment (PPE) software for sorting the simulation results and generating bug tracking system reports. This linking depends upon the type of coverage or the bug. FIG. 3 illustrates the modification of the simulation and debug flow including a post-processing environment 319 employed in prior art to glean information from a simulation run. The prior art also employs the software monitor wrapper (SMW) 320 enabling more efficient use of simulation data.

Each simulation uses one or more test cases 300 and compares trace results from the individual RTL model 301 and Golden C-Model 302 simulations. The Golden C-Model simulation package 302 now typically includes special software probes within the software monitor wrapper (SMW) interface 320 sometimes called hooks that facilitate an interface designated software monitor wrapper (SMW) 320. The software monitor wrapper 320 processes the simulation results, presenting them in the form of software probe data for analysis by software external to the software monitor wrapper 320. In FIG. 3, two paths illustrate this feature.

First, functional monitors 309 probe the functional results gathered at the software monitor wrapper interface 315, and pass these to the functional coverage database 313. Specification input block 318 illustrates manual interaction by engineers updating the functional monitors to account for a number of items. Among these are:

1. Specific functionality that will not be implemented in the present design and that will be designated unallowed states to the users; and 2. Functionality that will be implemented in a future revision of the design but will not be a part of the introductory device specifications.

Secondly, the Golden C-Model simulation 302 within the software monitor wrapper 320 generates input to simulation trace comparisons 304. Simulation trace comparisons 304 includes a change detector output that clearly marks differences between the results of RTL simulation 301 and Golden C-Model simulation 302. The detailed comparisons data report 305 includes a full record of pass and failed tests and the detailed output of the change detector function of simulation trace comparisons 304. The engineer makes use of these results processed in a pass/fail report 311 to arrive at a failed tests disposition 307. The engineer also uses these results in failure analysis 314. Passed tests 306 are accounted for in the functional coverage database 313.

Results of the failure analysis 314 are recorded in the bug tracking system (BTS) report 316. Bugs seen as fixed in bug tracking system report 316 are noted by issue fix confirmed block 310 and fixed bugs are discarded at 321.

SUMMARY OF THE INVENTION

This invention provides a means for monitoring and tracking of pending bugs via pending bug monitors and automates the rejection or debug-postponement of failing test cases that get hit by already known/pending bugs. This allows developers/debuggers to focus on finding and analyzing only new failures leading to identification of new bugs and automatically track the status of such bugs until fixed. This improves design development efficiency many fold, and lets design engineers and verification engineers focus on real, new and unique issues. This is especially true when test cases are generated in a random way and the test case contents are unknown.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
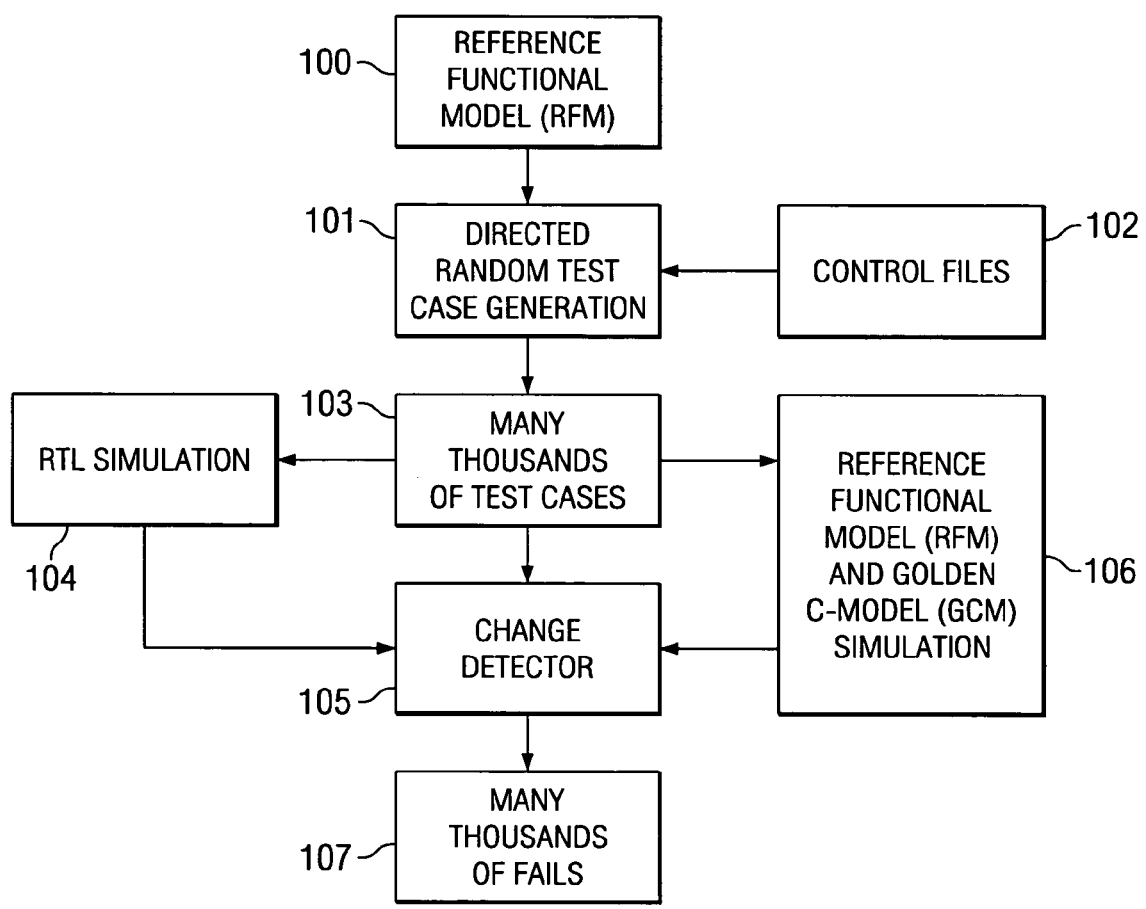
FIG. 1 illustrates the conventional high-level flow diagram relating design models, simulation control, test patterns, test cases, and simulation results for complex digital integrated circuit debugging (Prior Art)
Figure 2:
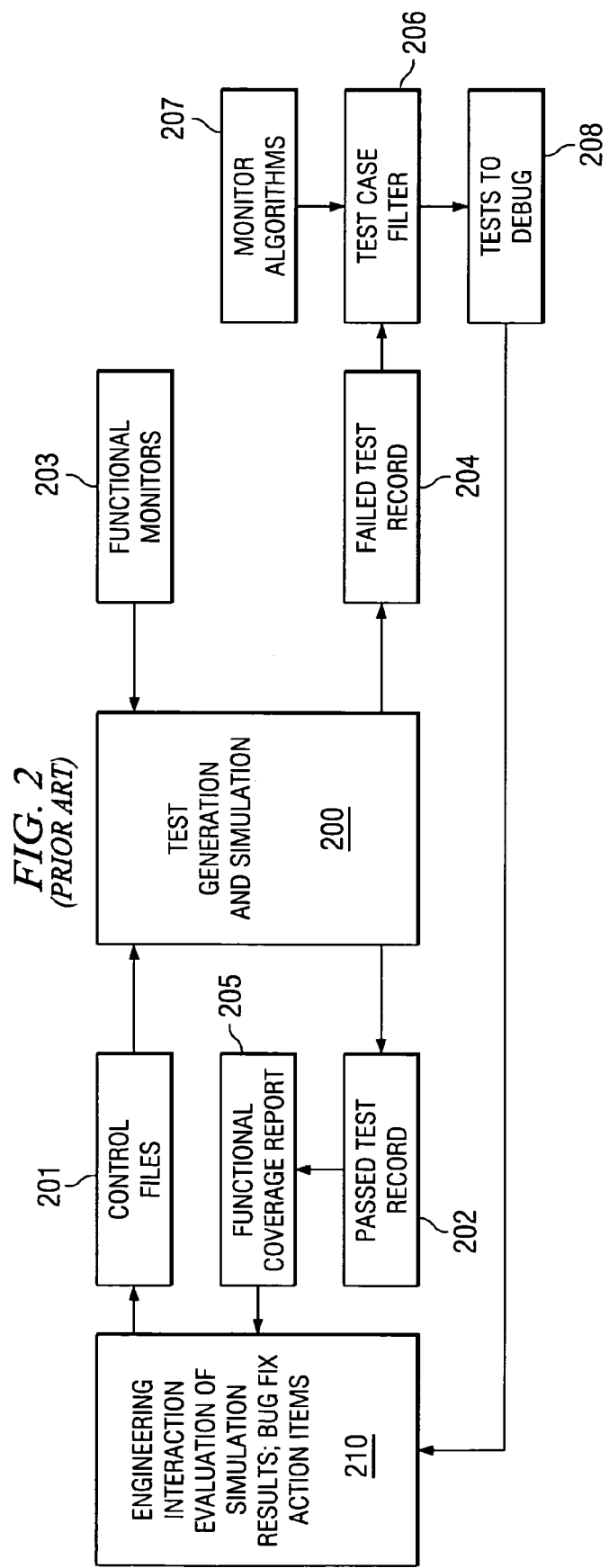
FIG. 2 illustrates the concepts of conventional functional coverage and monitoring and their interaction with test generation and simulation flow on a complex digital processor product (Prior Art)
Figure 3:
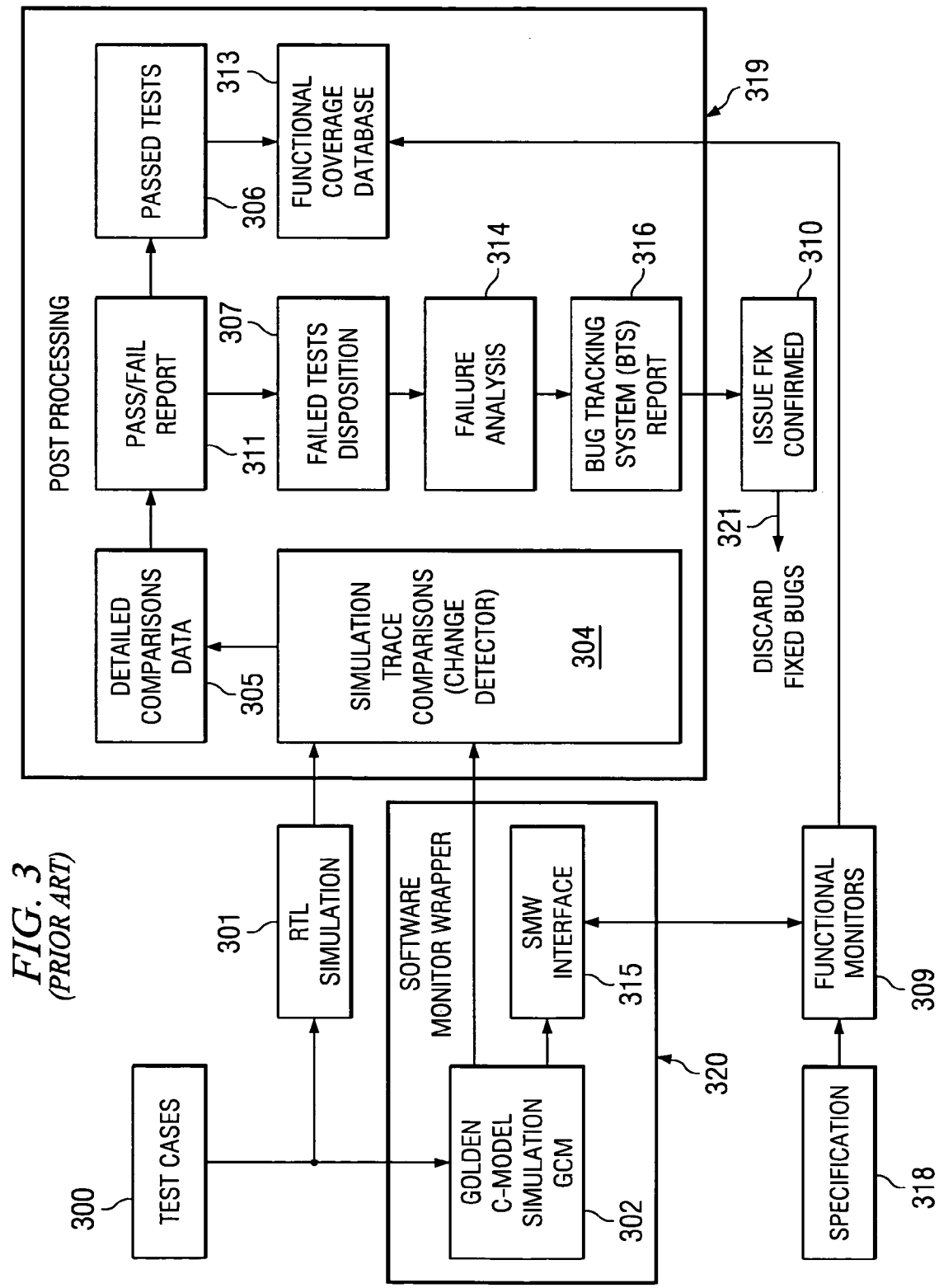
FIG. 3 illustrates the concepts of simulation and monitoring in the post-processor environment debug of a complex digital processor product (Prior Art)

The major thrust of this invention is to provide the best possible information to all working on the design or its verification as to what the true most up-to-date status is on all bugs, new or old. Several new key aspects of the invention should be emphasized here:

1. Random Tests: the invention addresses the reality that most test cases have been generated by a random test generator. Viewed in isolation by even an engineer who understands the operational aspects of a device, the test will often seem meaningless or be difficult to understand or analyze.

2. Real Time Analysis: the invention places great importance in the leverage that results from analysis in real time. The detailed behavior of many thousands of device signals and busses are captured as they occur for comprehensive analysis and screening.

3. Confirmation of Design Fixes: the invention provides clear direction for elimination of further analysis when bugs have been found to have been fixed.

4. Functional Coverage Input: the invention provides a driver for input into updates on functional coverage status.

Elements of the Design, Simulation, DV Interface

The design process is a very complex one that includes implementation of large blocks of logic described in register transfer language (RTL) intended to exactly copy the behavior of the golden C-model of the device. As each register transfer language block is added and refined on a daily basis there is a need for daily simulations to verify the quality of the match of the register transfer language with the golden C-model. These daily simulations that grow in complexity and length as the design progresses are referred to as regression simulations.

One can easily understand that a regression run on an over night basis could yield many thousands of failures in need of debug attention. Basically each failure or bug needs individual attention and must be analyzed and understood so that a bug monitor may be developed to track it. Formerly, reports and communications about the nature of the bug findings were directed to screen the massive failures, many of which were repetitive in nature and others which had their source in the problem that the testing was exercising an incompletely implemented device. While all these failures are clearly valid, there is an obvious need to screen out those bugs which are (a) repetitive (one unique bug may show 1000 repetitive failures) or which involve (b) unimplemented logic.

Consider the following three areas of application for pending bug monitors.

1. Random Test Cases: Test cases have been generated by means approved by all involved technical personnel. But some of these cases are not well understood by those engaged in the debug task. Many are generated by random test generators and are not easily analyzed. The use of pending bug monitors allows for screening of these random test cases for validity during the golden model simulation before passing them on to the register transfer language simulation.

2. Design Constraints: Some tests do not comprehend the many constraints on the design that dictate that some test cases, while plausible in the functional sense, are not allowed but have not been excluded from the test case suite. Some of these test cases may be testing for as yet not implemented behavior. These need to be identified and isolated.

3. Specification Constraints: Some tests do not comprehend the many constraints on the design that dictate that some test cases are unallowed states and the corresponding behavior should not be debugged. These need to be identified and isolated.

The scope of this invention is not limited to any particular monitor language or to any type of Golden C-Model provided that model can be fitted with software probes. Nor is the invention limited to the type of target model. Register transfer language models or other functional models are equally applicable.

1. Pending Bugs Monitor Coding (PBM Coding) PBM coding is used here to represent any software language which addresses design functional coverage. Pending bug monitors coding is not restricted to any particular monitor language. There are a number of qualified languages currently being employed in the design verification discipline.

2. Software Monitor Wrapper (SMW) Any simulation environment fitted with suitable software probes and hooks which can monitor detailed simulation activities happening in a design-under-test (DUT) setting can be used for pending bugs detection.

3. Target of Pending Bugs Monitors Pending bug monitors can be applied to any target design or model under test, but not restricted to any particular Golden C Model (GCM). Hooking up a software monitor wrapper (SMW) with the design under test (DUT) simply enables pending bug monitors. Pending bug monitors can work equally well to filter out pre-known bugs in register transfer language designs or other verification components or modules.

Figure 4:
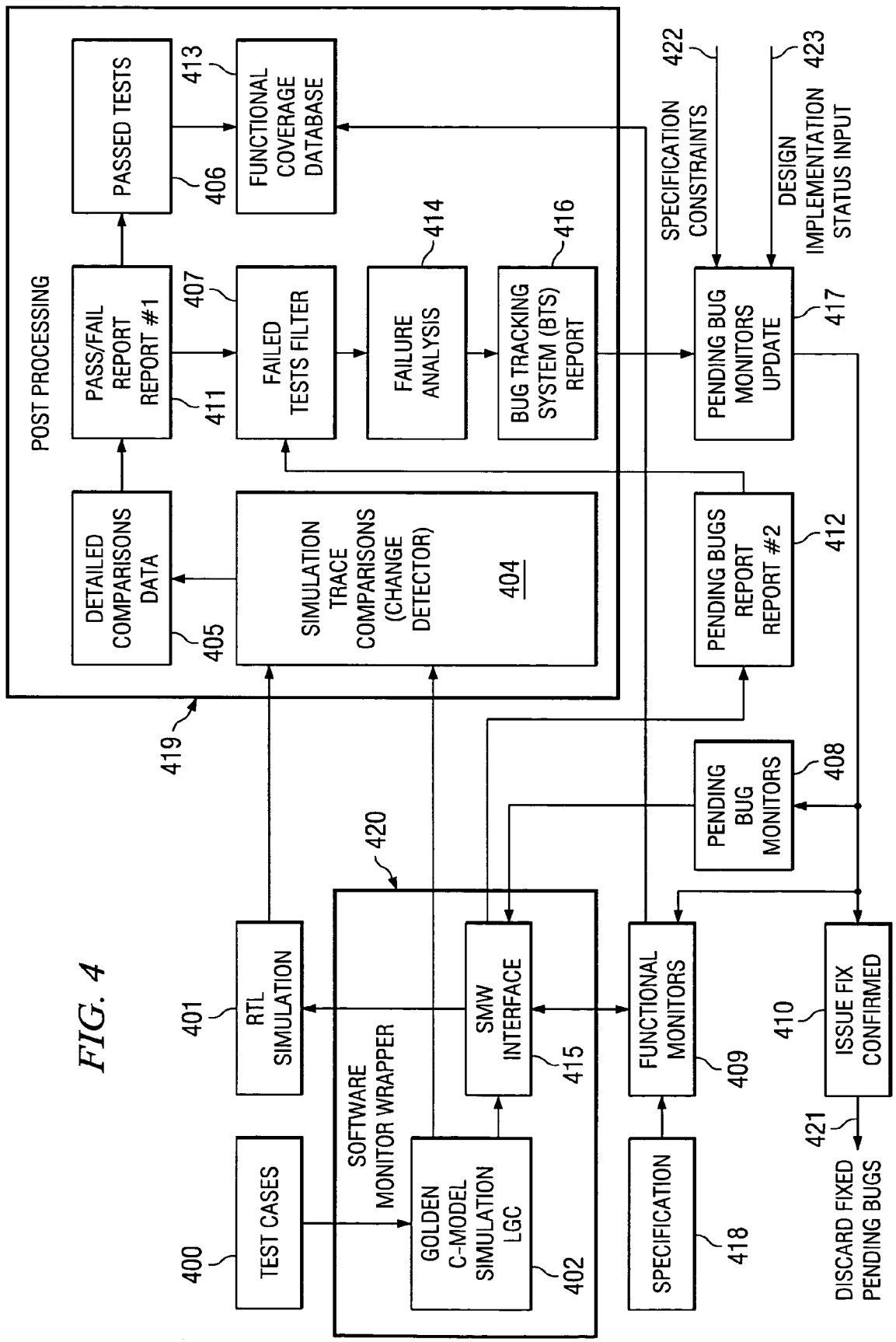
FIG. 4 illustrates the methodology and use of pending bug monitors in the debugging of complex digital processor products by employing software monitor wrappers according to the techniques of this invention.

FIG. 4 illustrates improvements in the filtering of failed tests in block 407. The pending bug monitor block 408, the pending bugs report 412 and the pending bugs monitor update block 417 with specification constraint inputs 422 and design implementation status inputs 423 are the key added elements vastly improving the effectiveness of the debugging effort.

In FIG. 4, test cases 400 are applied directly only to golden C-model (GCM) simulation 402. Only after the random test cases are checked for validity in the golden model simulation 402 are they passed on to the register transfer language simulation 401. Applying the techniques of this invention involves intensive use of the software monitor wrapper (SMW) 420. Software monitor wrapper interface 415 performs a virtual probing of an enormous number of test nodes in the device. This is made possible by upgrades that have recently become common in golden C-Models. Code statements in the model allow software probes to derive all states occurring. This enables decisions based on very intensive results analysis. Any or all behavioral aspects of the design may be viewed and subjected to processing by the pending bug monitors block 408 and the functional monitors block 409. The software monitor wrapper interface 415 performs a check on random test cases, screening them to assure their validity before these test cases are submitted to the register transfer language model for simulation. Simulation results from the golden C-Model are also fed directly to the simulation trace comparison block 404 that includes a change detector feature. Comprehensive outputs from the software monitor wrapper interface block 415 are passed to the pending bugs report block 412.

The detailed comparisons data block 405 yields comprehensive pass/fail results and change detector results from the simulation comparisons 404 on test cases 400 and these are stored in the Pass/Fail report 411. These composite results are then passed to the failed test filter block 407. This failed test filter block 407 receives inputs from the pending bugs report 412 and represents a major step in advancing debugging procedures. Failed test filter block 407 compares failed tests and reconciles with pending bug reports hits from pending bug report block 412. Bugs that hit in the pending bug monitors block 408 are eliminated from consideration in the failure analysis block 414. Bug tracking system (BTS) block 416 passes a new issue for debug to the pending bug monitors update block 417. Here new pending bug monitors are generated as necessary and added to the pending bug monitors block 408. Pending bug monitors update block 417 may also be used as a driver to update functional monitors 409 as needed. Further, any pending bugs confirmed as fixed are passed to issue fix confirmed block 410, which discards these fixed pending bugs 421 removing them from consideration.

To understand how the simulation/design verification flow illustrated in FIG. 4 affects the design verification effort, consider a typical possible scenario. Suppose a full regression has been run yielding 10,000 failed test cases. This might happen despite existing bug monitor action to cull the effects of already-addressed pending bugs. An engineer in debugging one or more of the new 10,000 failures finds a bug having a characteristic fail mode that appears to be repetitive in the simulation. Upon developing and installing a new pending bug monitor, the engineer calls for a repeat simulation with the new pending bug monitor in place. The repeat simulation logs 1000 hits on the new pending bug and includes this in pending bugs report block 412. While pass/fail report block 411 may still show 10,000 failed test cases, the action of failed test filter block 407 removes the 1000 cases experiencing new pending bug monitor hits allowing the focus of debug analysis to be brought to bear on other 9000 real failures.

The pass/fail report 411 and the pending bug report 412 may be visualized as follows in Table 1.

TABLE 1

| Pass/Fail Report | | Pending Bugs Report | | | |
|---|---|---|---|---|---|
| TC1 | Pass | PBM1 | TC1 | TC12 | |
| TC2 | Fail | PBM2 | TC9 | TC10 | |
| TC3 | Fail | PBM3 | TC12 | | |
| . | . | . | . | . | . |
| . | . | . | . | . | . |
| TC12 | Fail | PBM25 | TC34 | TC44 | TC53 |
| TC13 | Fail | PBM26 | TC66 | TC76 | |
| TC14 | Fail | PBM27 | TC78 | TC85 | TC112 |
| . | . | . | . | . | . |
| . | . | . | . | . | . |
| TCxxxx | Pass | PBMyyy | TC234 | | |

The pass/fail report gives a complete listing of all test cases pass or fail. The pending bug report gives a list of all hits for each pending bug monitor. The combined reports may be mapped by the failed test filter 407 into one result determining which tests are to be debugged in failure analysis block 414.

PENDING BUG MONITOR EXAMPLES

When a test case is run on a design model and the simulation result comparing reference functional model to the golden C-model finds the test case to be identical on both models, then the test case has been verified to be passing. If there is mismatch in the simulation results, then the test case is failing. Any mismatch could be due to:

1. Test case being not valid.
2. Golden C-Model (GCM) behavior being faulty.
3. Reference Functional Model (RFM) being faulty.
4. Incorrect or Incomplete Specification.

In order to determine the reason for the test case failure, one could go through the complete and often very tedious manual debug process and find the problem is an already known case. Pending bug monitors can be used to filter out all known failure cases.

Below are two examples of pending bug monitors. The first considers a known problem for which a first-time failure analysis resulted in the previous creation of a pending bug monitor. Assume the root cause was a faulty test case. This pending bug monitor remains active until test generation software is corrected for the test case generation issue and otherwise remains active.

A second example concerns a register-transfer language design bug in queue for a fix by the designer. A monitor is created to detect the scenario just the same as the known bug conditions in all other failing test cases where the failure would be due to the particular pending bug.

TABLE 2

KEYWORDS/ACRONYMS

| | |
|---|---|
| DSN | Design (DUT, RTL code) |
| BTS | Bug Tracking System, a tool for recording/tracking the bugs |
| MON | Monitor begin (SMW keyword) |
| ENDMON | Monitor end (SMW keyword) |
| Instr | Instruction |
| Exe | Execution pipeline phase of instruction |
| Pending_bug( ) | Tags a monitor as a pending bug monitor (SMW keyword) |
| Stopsim( ) | Stop the simulation |

Example 1

This is a simple bug in the design related to the execution of a specific arithmetic instruction. It has two conditions (a) and (b).

Bug description: Design produces wrong result and test case fails when an instruction: (a) ADD_MWK is executed, and M40 status bit is set. This instruction is: ADD an immediate value K with sensitivity to a sign control bit named M40, when storing back the result to end target: and (b) Bad result occurs only when this M40 bit is set (i.e. enabled).

Pending Bug Monitor Actual Code (Example 1)

```
MON(DSN_BTS_71_M40)
    if ( (Instr1[Exe] == ADD_MWK) && ( M40_val == M40_ON ))
    {
        pendingBug( );
        stopSim( );
    }
ENDMON
```

This first pending bug monitor example has the name: DSN_BTS_71_M40. The first line in the monitor code checks if the current instruction is ADD_MWK and if the M40 bit is set. Instr1[Exe] is a variable holding the current instruction ID. M40_val is a variable name, which holds one of two possible values: M40_ON or M40_OFF, the two possible states of the status bit M40. If the first line is evaluated as true statement, then the monitor will execute two software monitor wrapper functions. The function pendingBug( ) will report important information about the bug. This includes: (1) the test name; (2) where the bug was found; (3) the cycle number at which the bug occurred; and (4) the program address. The code stopSim( ) will stop the current test simulation after it has found a first bug and not let the problem test case run unnecessarily. This conserves simulation time for other tests. Other submitted test cases will proceed.

Example 2

This is a simple bug in the test generator, where an invalid parallel instruction pair is generated and consequently the test case fails.

Bug Description: The processor being simulated allows two instructions to be executed in parallel, but some parallel pairs are invalid. In most cases the test case generator comprehends what pair combinations of instructions are valid, but in this case the built-in knowledge of instruction parallelism was inadequate. This problem happens when the LD_MAR instruction is generated parallel with PORT_READ qualifier instruction. This is an invalid pair and must not be generated, but until the generator can be fixed, existing tests must be screened for this bug.

Pending Bug Monitor Actual Code (Example 2)

```
MON(RAVEN_BTS_82)
    if ( (Instr1[Dec] == LD_MAR) && ( Instr2[Dec] == PORT_READ))
    {
        rejectBug( );
        stopSim( );
    }
ENDMON
```

This second example of pending bug monitor code detects the bug condition in the decode phase. This is done by using Instr1[Dec] instead of Instr1[Exe]. Then instead of calling pendingBug( ) function, it calls rejectBug( ). This will make the test a rejected test and assures it will never run again. In case of real design bugs, the procedure would be to call the pendingBug( ) function as in the first example. After a bug is fixed in the design, then tests can be rerun to check whether it passes. In the case of random generator bugs there is no need for this procedure.

What is claimed is:

1. A method of monitoring pending bugs in circuit under design, said method comprising the steps of:
   supplying a plurality of test cases to a simulation of a circuit design;
   supplying the plurality of test cases to a reference model;
   comparing results from the simulation of the circuit design with results obtained from a reference model for each test case;
   detecting each test case where results from the simulation of the circuit design differs from the results obtained from the reference model and designating each such test case as a bug;
   comparing each bug with a pending bug list;
   updating the pending bug list with non-repetitive new bugs corresponding to test cases directed to implemented behavior of simulation of the circuit design;
   analyzing for correction bugs in the pending bug list;
   modifying the simulation of the circuit design attempting to correct bugs in the pending bug list; and
   repeating said steps of supplying, comparing, detecting, comparing, updating, analyzing and modifying in plurality of iterations until the circuit design is complete and there are no bugs in the pending bug list.

2. The method of claim 1, wherein:
   said step of updating the pending bug list eliminates bugs from the pending bug list caused by test cases directed to yet to be implemented behavior in simulation of the circuit design.

3. The method of claim 1, wherein:
said step of updating the pending bug list eliminates bugs from the pending bug list caused by test cases directed to unallowed states in the reference model.

4. The method of claim 1, wherein:
said step of updating the pending bug list eliminates bugs from the pending bug list caused by faulty test cases.

5. The method of claim 4, further comprising:
eliminating test cases from plurality of test cases supplied to the simulation of the circuit caused by faulty test cases.

6. The method of claim 1, wherein:
said step of supplying a plurality of test cases to a simulation of a circuit design includes
   randomly generating test cases,
   testing validity of the randomly generated test cases by supply to the reference model, and
   eliminating from the plurality of test cases randomly generated test cases determined to be invalid.

* * * * *